(12) United States Patent
Hwang et al.

(10) Patent No.: US 12,395,161 B2
(45) Date of Patent: Aug. 19, 2025

(54) FLIP-FLOP BASED ON CLOCK SIGNAL AND PULSE SIGNAL

(71) Applicant: SAMSUNG ELECTRONICS CO., LTD., Suwon-si (KR)

(72) Inventors: Hyunchul Hwang, Suwon-si (KR); Jeongjin Lee, Suwon-si (KR); Seungman Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/507,867

(22) Filed: Nov. 13, 2023

(65) Prior Publication Data

US 2024/0162893 A1 May 16, 2024

(30) Foreign Application Priority Data

Nov. 14, 2022 (KR) .......................... 10-2022-0152003
Apr. 27, 2023 (KR) .......................... 10-2023-0055654

(51) Int. Cl.
*H03K 3/012* (2006.01)
*G01R 31/3185* (2006.01)
(Continued)

(52) U.S. Cl.
CPC .................. *H03K 3/356121* (2013.01); *G01R 31/318541* (2013.01); *H03K 3/012* (2013.01); *H03K 3/037* (2013.01)

(58) Field of Classification Search
CPC .. H03K 3/012; H03K 3/037; H03K 3/356113; H03K 3/356121; G01R 31/318541
See application file for complete search history.

(56) References Cited

U.S. PATENT DOCUMENTS

| | | | | |
|---|---|---|---|---|
| 6,420,903 B1 * | 7/2002 | Singh | ..................... | G06F 9/3869 326/98 |
| 6,433,603 B1 * | 8/2002 | Singh | ..................... | H03K 3/012 327/210 |

(Continued)

FOREIGN PATENT DOCUMENTS

| | | |
|---|---|---|
| CN | 113381748 | 9/2021 |
| KR | 10-1879830 | 7/2018 |

OTHER PUBLICATIONS

EESR dated Apr. 24, 2024 in corresponding EP Patent Application No. 23209882.2.

*Primary Examiner* — Patrick O Neill
(74) *Attorney, Agent, or Firm* — Morgan, Lewis & Bockius LLP

(57) ABSTRACT

A flip-flop (FF) includes a first n-channel metal oxide semiconductor (NMOS) transistor connected to a ground line, a first p-channel metal oxide semiconductor (PMOS) transistor connected to a power voltage line, a second NMOS transistor connecting a first node to the first NMOS transistor, a second PMOS transistor connecting the first node to the first PMOS transistor, a third NMOS transistor and a fourth NMOS transistor, connected to the second NMOS transistor in parallel, and forming a first discharge path for connecting the first node to the ground line, a third PMOS transistor and a fourth PMOS transistor, connected to the second PMOS transistor in parallel, and forming a first charge path for connecting the first node to the power voltage line, a keeper circuit connected to the first node to maintain a voltage level of the first node.

20 Claims, 15 Drawing Sheets

(51) Int. Cl.
*H03K 3/037* (2006.01)
*H03K 3/356* (2006.01)

(56) References Cited

U.S. PATENT DOCUMENTS

| | | |
|---|---|---|
| 6,608,513 B2 | 8/2003 | Tschanz et al. |
| 7,548,102 B2 | 6/2009 | Ramaraju et al. |
| 7,671,653 B2 | 3/2010 | Harris et al. |
| 8,324,951 B1 | 12/2012 | Zarkesh-Ha et al. |
| 10,243,567 B2 | 3/2019 | Kong et al. |
| 11,398,814 B2 | 7/2022 | Hsu et al. |
| 2002/0149409 A1 | 10/2002 | Tokumasu et al. |
| 2020/0186131 A1 | 6/2020 | Rengarajan et al. |
| 2021/0270899 A1 | 9/2021 | Choi et al. |

\* cited by examiner

FLIP-FLOP BASED ON CLOCK SIGNAL AND PULSE SIGNAL

CROSS-REFERENCE TO RELATED APPLICATION

This U.S. patent application claims priority under 35 U.S.C. § 119 to Korean Patent Application Nos. 10-2022-0152003 filed on Nov. 14, 2022, and 10-2023-0055654, filed on Apr. 27, 2023 in the Korean Intellectual Property Office, the disclosures of which are incorporated by reference in their entireties herein.

1. TECHNICAL FIELD

The inventive concept relates to a flip-flop (FF), and more particularly, to a flip-flop (FF) based on a clock signal and a pulse signal.

2. DISCUSSION OF RELATED ART

An integrated circuit (IC) may include a plurality of sequential circuits. The sequential circuits may output output data based on input data and previously stored data. The sequential circuit may include, for example, a latch, a flip-flop (FF), or an integrated clock gating (ICG) cell.

The pulse-based FF includes one latch and has a short setup time. The setup time may be the amount of time required for the input data to the stable before an edge of a pulse signal can be used to begin latching the input data. An IC chip including the pulse-based FF may perform a high-speed operation. However, because the pulse signal on which the FF is based is generated by using a clock signal, a delay between the clock signal and an output signal may be large. Measures are required to increase performance of the FF by reducing the delay between the clock signal and the output signal while maintaining the pulse-based FF so that the setup time is shorter.

SUMMARY

The inventive concept relates to a pulse-based flip-flop (FF) in which a delay between a clock signal and an output signal is reduced.

According to an aspect of the inventive concept, there is provided a flip-flop (FF) including a first n-channel metal oxide semiconductor (NMOS) transistor, a first p-channel metal oxide semiconductor (PMOS) transistor, a second NMOS transistor, a second PMOS transistor, a third NMOS transistor, a fourth PMOS transistor, a third PMOS transistor, a fourth PMOS transistor, a keeper circuit, and an inverter. The first n-channel metal oxide semiconductor (NMOS) transistor is connected to a ground line and operates based on an input signal. The first p-channel metal oxide semiconductor (PMOS) transistor is connected to a power voltage line and operates based on the input signal. The second NMOS transistor connects a first node to the first NMOS transistor and operates based on a pulse signal. The second PMOS transistor connects the first node to the first PMOS transistor and operates based on an inverted pulse signal that is inverted respect to the pulse signal. The third NMOS transistor and the fourth NMOS transistor are connected to the second NMOS transistor in parallel and form a first discharge path for connecting the first node to the ground line based at least on a clock signal. The third PMOS transistor and the fourth PMOS transistor are connected to the second PMOS transistor in parallel and form a first charge path for connecting the first node to the power voltage line based at least on an inverted clock signal that is inverted with respect to the clock signal. The keeper circuit is connected to the first node to maintain a voltage level of the first node. The inverter generates an output signal by inverting a signal at the first node.

According to another aspect of the inventive concept, there is provided an FF including a first n-channel metal oxide semiconductor (NMOS) transistor, a first p-channel metal oxide semiconductor (PMOS) transistor, a second NMOS transistor, a second PMOS transistor, a third NMOS transistor, a fourth NMOS transistor, a keeper circuit, and an inverter. The first n-channel metal oxide semiconductor (NMOS) transistor is connected to a ground line and operates based on an input signal. The first p-channel metal oxide semiconductor (PMOS) transistor is connected to a power voltage line and operates based on an input signal. The second NMOS transistor connects a first node to the first NMOS transistor and operates based on a pulse signal. The second PMOS transistor connects the first node to the first PMOS transistor and operates based on an inverted pulse signal. The third NMOS transistor and the fourth NMOS transistor are connected to the second NMOS transistor in parallel and form a first discharge path for connecting the first node to the ground line based at least on a clock signal. The keeper circuit is connected to the first node to maintain a voltage level of the first node. The inverter generates an output signal by inverting a signal at the first node.

According to another aspect of the inventive concept, there is provided an FF including a scan multiplexer, a first n-channel metal oxide semiconductor (NMOS) transistor, a first p-channel metal oxide semiconductor (PMOS) transistor, a second NMOS transistor, a second PMOS transistor, a third NMOS transistor, a fourth NMOS transistor, a third NMOS transistor, a fourth NMOS transistor, a keeper circuit, and an inverter. The scan multiplexer selectively outputs either an input signal or a scan signal. The first n-channel metal oxide semiconductor (NMOS) transistor is connected to a ground line and operates based on an output signal of the scan multiplexer. The first p-channel metal oxide semiconductor (PMOS) transistor is connected to a power voltage line and operates based on an output signal of the scan multiplexer. The second NMOS transistor is connects a first node to the first NMOS transistor and operates based on a pulse signal. The second PMOS transistor connects the first node to the first PMOS transistor and operates based on an inverted pulse signal inverted with respect to the pulse signal. The third NMOS transistor and the fourth NMOS transistor are connected to the second NMOS transistor in parallel and form a first discharge path for connecting the first node to the ground line based at least on a clock signal. The third PMOS transistor and the fourth PMOS transistor are connected to the second PMOS transistor in parallel and form a first charge path for connecting the first node to the power voltage line based at least on an inverted clock signal inverted with respect to the clock signal. The keeper circuit is connected to the first node to maintain a voltage level of the first node. The inverter generates an output signal by inverting a signal at the first node.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1A:
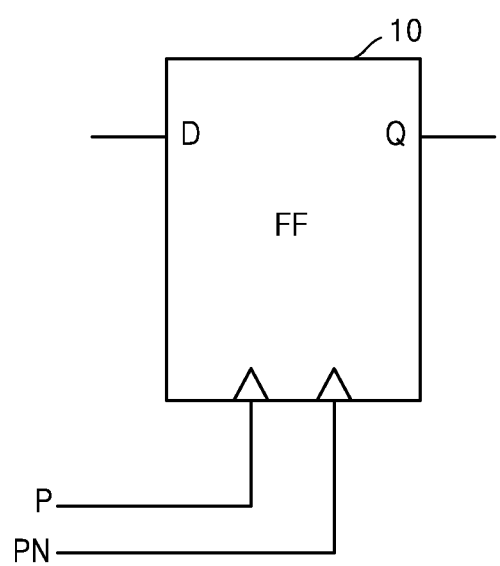
FIG. 1A is a diagram illustrating a logic symbol of a flip-flop (FF) according to a comparative example.
Figure 1B:
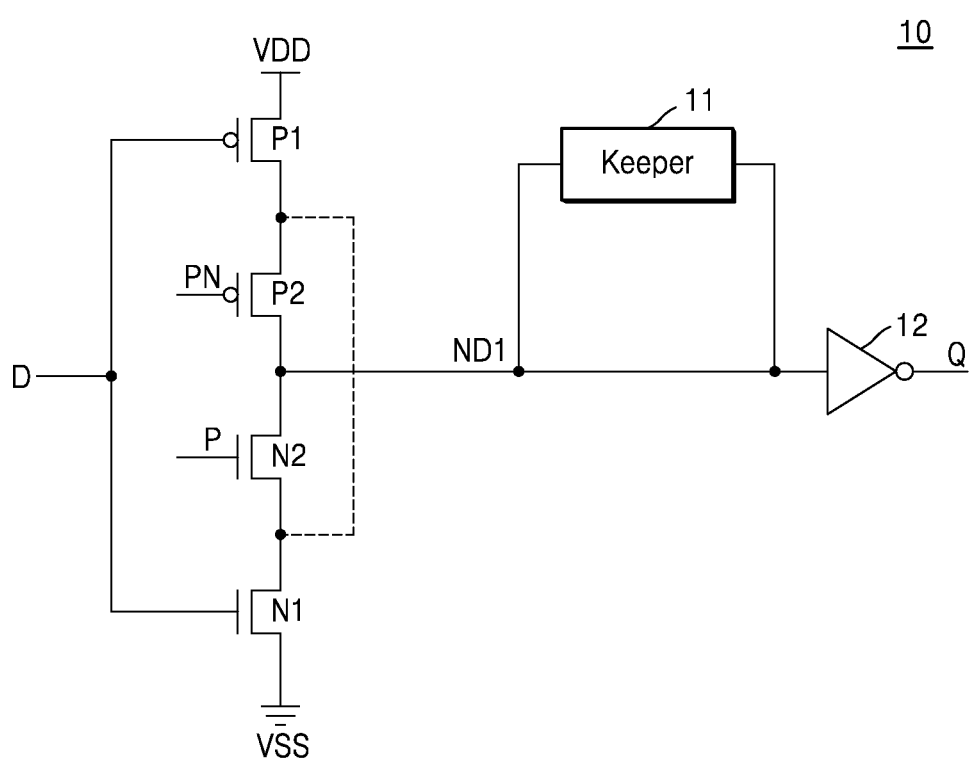
FIG. 1B illustrates a circuit diagram of an FF according to a comparative example, at a transistor level.

FIG. 1A is a diagram illustrating a logic symbol of a flip-flop (FF) 10 according to a comparative example, and FIG. 1B illustrates a circuit diagram of the FF 10 according to the comparative example at a transistor level.

Referring to FIG. 1A, the FF 10 receives an input signal D and latches the input signal D according to a pulse signal P to output an output signal Q.

The FF 10 may receive the pulse signal P and an inverted pulse signal PN from a pulse generator. The pulse signal P and the inverted pulse signal PN input to the FF 10 may be generated based on a clock signal or an inverted clock signal. The pulse generator may output the pulse signal P and/or the inverted pulse signal PN to the FF 10 based on a clock signal and/or the inverted clock signal. Since the pulse signal P and the inverted pulse signal PN may be generated by passing the clock signal through a plurality of logic devices (such as an inverter and a NAND gate), they may be generated later than the clock signal (the clock signal that is not passed through the plurality of logic devices). That is, the FF 10 according to the comparative example may have a relatively large clock to Q (CQ) delay value. The CQ delay may be a time required from when the clock signal transitions to "logic high" to when the output signal Q of the FF 10 transitions to "logic high".

Referring to FIG. 1B, the FF 10 according to the comparative example may include a first n-channel metal oxide semiconductor (NMOS) transistor N1, a second NMOS transistor N2, a first p-channel metal oxide semiconductor (PMOS) transistor P1, a second PMOS transistor P2, a keeper circuit 11, and an inverter 12.

The input signal D is input to gates of the first NMOS transistor N1 and the first PMOS transistor P1. When the input signal D is "logic high", the first NMOS transistor N1 is turned on. When the first NMOS transistor N1 is turned on, the second NMOS transistor N2 is connected to a ground line VSS. When the input signal D is applied as "logic high" to turn on the first NMOS transistor N1, and the pulse signal P is applied as "logic high" to turn on the second NMOS transistor N2, a first node ND1 is connected to the ground line VSS to be discharged. That is, a voltage level of the first node ND1 may be lowered.

When the input signal D is "logic low", the first PMOS transistor P1 is turned on. When the first PMOS transistor P1 is turned on, the second PMOS transistor P2 is connected to a power voltage line VDD. When the input signal D is applied as "logic low" to turn on the first PMOS transistor P1, and the inverted pulse signal PN is applied as "logic low" to turn on the second PMOS transistor P2, the first node ND1 is connected to the power voltage line VDD to be charged. That is, the voltage level of the first node ND1 may be increased.

The keeper circuit 11 maintains the voltage level of the first node ND1 constant. The inverter 12 inverts the voltage level of the first node ND1 to output the output signal Q. For example, when the voltage level of the first node ND1 is "logic high", the inverter 12 outputs the output signal Q of "logic low". When the voltage level of the first node ND1 is "logic low", the inverter 12 outputs the output signal Q of "logic high".

An operating speed of the FF 10 may correspond to a DQ delay. The DQ delay may be a time required from when the input signal D of the FF 10 transitions to "logic high" to when the output signal Q of the FF 10 transitions to "logic high". The DQ delay may be the sum of setup times for the CQ delay. The setup time represents a relationship between the input signal D of the FF 10 and the clock signal, and how far in advance the input signal D is to be set up as "logic high" before a clock time is input to the FF 10.

In the FF 10 using a high-performance pulse signal P, the setup time may be very short. Thus, the biggest factor determining performance of FF 10 may be the CQ delay. However, because the FF 10 according to the comparative example outputs the output signal Q according to the pulse signal P and the inverted pulse signal PN generated based on the clock signal, the above CQ delay is inevitably large.

Figure 2:
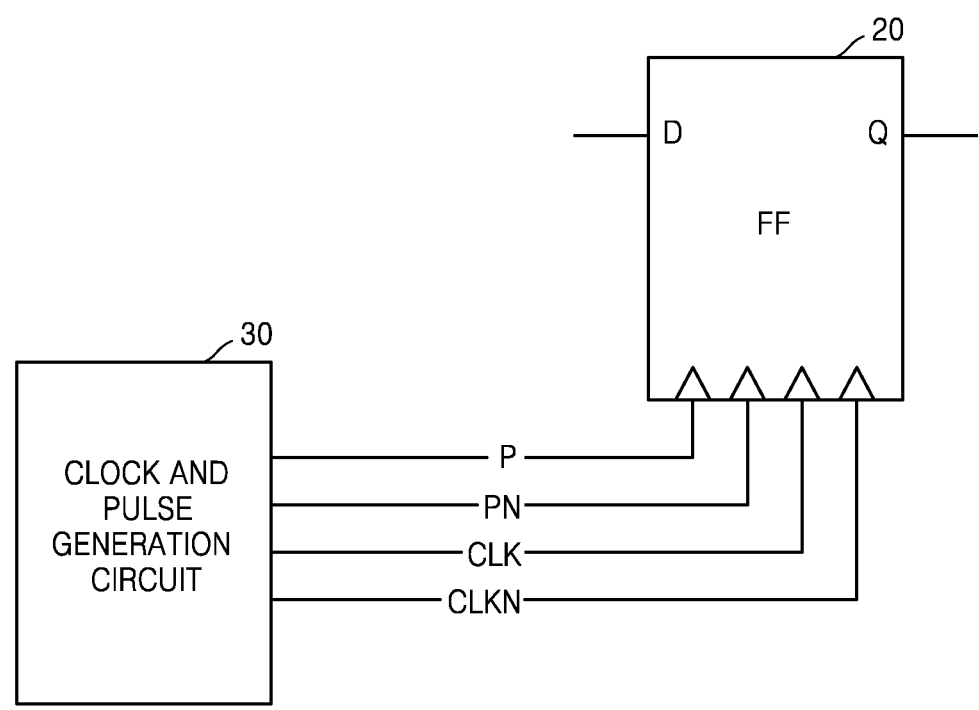
FIG. 2 is a diagram illustrating an FF and a clock and pulse generation circuit, according to an embodiment.

FIG. 2 is a diagram illustrating an FF 20 and a clock and pulse generation circuit 30 according to an embodiment.

Referring to FIG. 2, the FF 20 receives an input signal D based on a plurality of signals and may output an output signal Q. The plurality of signals may include a pulse signal and a clock signal. For example, the FF 20 may output the output signal Q based on all of a pulse signal P, an inverted pulse signal PN, a clock signal CLK, and an inverted clock signal CLKN. The clock and pulse generation circuit 30 may generate the plurality of signals.

According to an embodiment, the FF 20 activates a first discharge path based at least on the clock signal CLK. The first discharge path may be an electrical path different from a second discharge path activated according to an application of the pulse signal P. The FF 20 may activate a first charge path based at least on the inverted clock signal CLKN. The first charge path may be an electrical path different from a second charge path activated according to an application of the inverted pulse signal PN. A detailed description of the first discharge path and the first charge path will be described later.

Figure 3A:
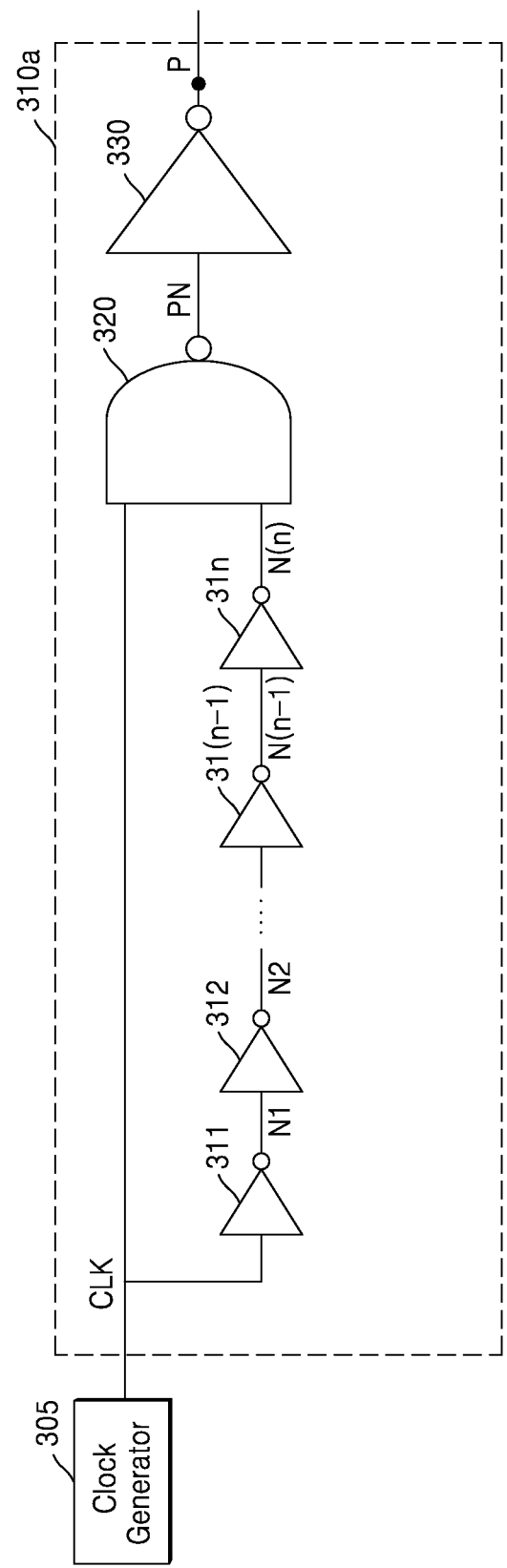
FIG. 3A is a block diagram of a clock and pulse generation circuit having a feed-forward structure according to an embodiment.
Figure 3B:
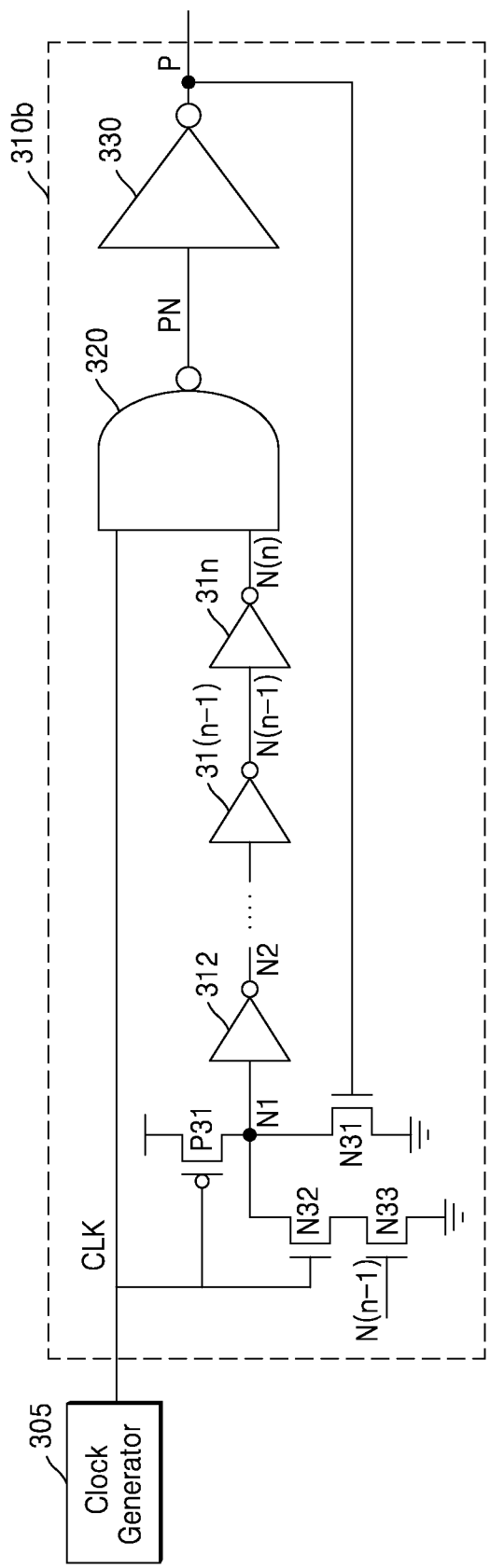
FIG. 3B is a block diagram of a clock and pulse generation circuit having a feedback structure, according to an embodiment.

FIG. 3A is a block diagram of the clock and pulse generation circuit 30 having a feed-forward structure according to an embodiment. FIG. 3B is block diagram of the clock and pulse generation circuit 30 having a feedback structure according to an embodiment.

Referring to FIG. 3A, the clock and pulse generation circuit 30 includes a clock generator 305 and a pulse generator 310a. The clock generator 305 may generate the clock signal CLK serving as a reference signal for generating the pulse signal P and the inverted pulse signal PN. The clock generator 305 may provide the generated clock signal CLK to the pulse generator 310a. For example, the clock generator 305 may be an electronic oscillator.

The pulse generator 310a may include a plurality of inverters 311 to 31n (having outputs N1, . . . N(n-1) and N(n) respectively, in one example), NAND logic 320 (e.g., a NAND gate), and an inverter 330. Because the pulse generator 310a of FIG. 3A does not feedback the output pulse signal P as an input thereof, the pulse generator 310a of FIG. 3A may be understood as having a feed-forward structure. One input terminal of the NAND logic 320 may receive the clock signal CLK. The clock signal CLK may generate the inverted clock signal CLKN while sequentially passing through the plurality of inverters 311 to 31n. For example, an output signal of each of the odd-numbered inverters 311, . . . , and 31(n-1) may be the inverted clock signal CLKN. An output signal of each of the even-numbered inverters 312, . . . , and 31n may be the clock signal CLK. The NAND logic 320 may receive the clock signal CLK, which is the output signal of the nth inverter 31n, through the other input terminal thereof. All signals input to the NAND logic 320 are clock signals CLK, but the clock signal CLK received through the other input terminal of the NAND logic 320 may be delayed by a delay introduced by passing through the plurality of inverters 311 to 31n. The NAND logic 320 may compare the clock signal CLK generated by the clock generator 305 with the delayed clock signal CLK passing through the plurality of inverters 311 to 31n to output an inverted pulse signal PN of "logic low" only when both are "logic high". The inverter 330 may receive the inverted pulse signal PN and may invert the received inverted pulse signal PN to output the pulse signal P.

Referring to FIG. 2 together, it may be noted that the FF 20 according to an embodiment receives all of the clock signal CLK, the inverted clock signal CLKN, the pulse signal P, and the inverted pulse signal PN. The clock and pulse generation circuit 30 may provide the clock signal CLK generated by the clock generator 305 to the FF 20. The clock and pulse generation circuit 30 may provide the output signal of the inverter 311 at the front end of the plurality of inverters 311 to 31n to the FF 20 as the inverted clock signal CLKN. The clock and pulse generation circuit 30 may provide an output of the NAND logic 320 to the FF 20 as the inverted pulse signal PN. The clock and pulse generation circuit 30 may provide an output of the inverter 330 to the FF 20 as the pulse signal P.

Referring to FIG. 3B, the clock and pulse generation circuit 30 may include a clock generator 305 and a pulse generator 310b. The clock generator 305 may generate the clock signal CLK serving as a reference signal for generating the pulse signal P and the inverted pulse signal PN. The clock generator 305 may provide the generated clock signal CLK to the pulse generator 310b.

The pulse generator 310b may further include a first NMOS transistor N31, a second NMOS transistor N32, a third NMOS transistor N33, and a first PMOS transistor P31 in addition to a plurality of inverters 311 to 31n, a NAND logic 320, and an inverter 330. While the pulse generator 310a of FIG. 3A does not feedback the output pulse signal P as the input thereof, the pulse generator 310b of FIG. 3B inputs (feeds back) the pulse signal P to a gate of the first NMOS transistor N31. Therefore, the pulse generator 310b of FIG. 3B may be understood as having a feedback structure. The second NMOS transistor N32 may receive the clock signal CLK through a gate thereof. The third NMOS transistor N33 may receive an output of the (n-1)th inverter 31(n-1) through a gate thereof. The output of the (n-1)th inverter 31(n-1) may be the inverted clock signal CLKN. The gate of the first PMOS transistor P31 may receive the clock signal CLK generated by the clock generator 305. Because the NAND logic 320 and the inverter 330 are the same as those of FIG. 3A, description thereof is omitted.

In the above-described embodiment, the inverted clock signal CLKN provided to the FF 20 is illustrated as using an output of the inverter 311. However, the inventive concept is not limited thereto. For example, the clock generator 305 may provide the clock signal CLK to the pulse generators 310a and 310b and an additional inverter that generates the inverted clock signal CLKN and provides the generated inverted clock signal CLKN to the FF 20. For example, the additional inverter may be located outside the pulse generators 310a and 310b.

Figure 4A:
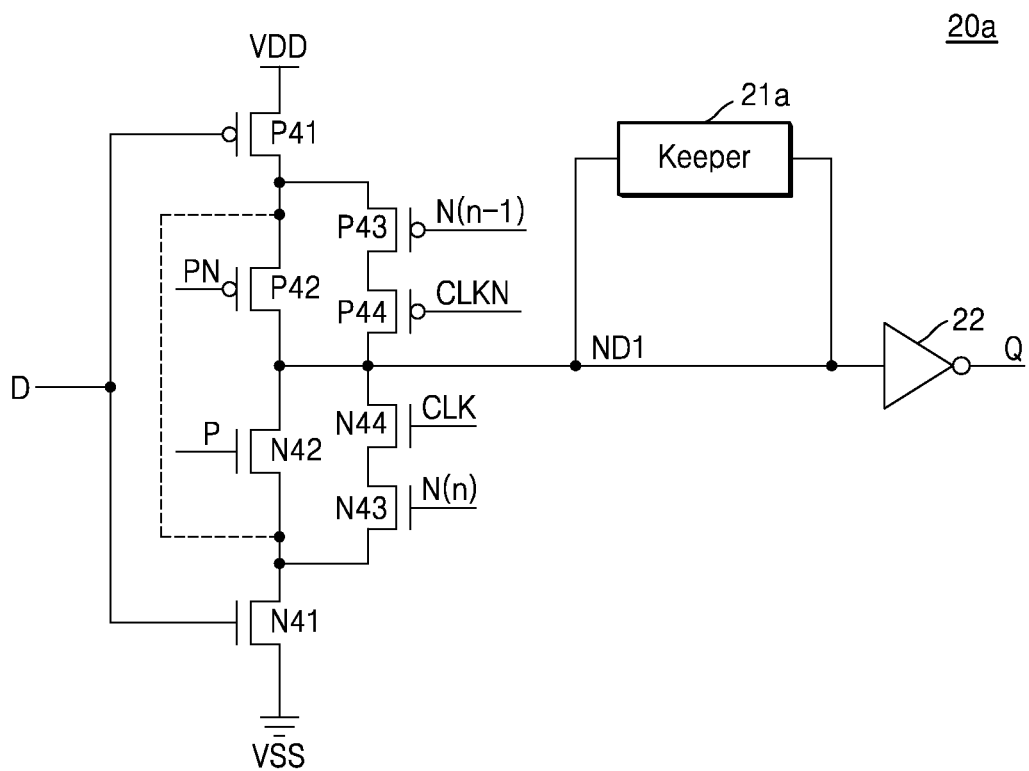
FIG. 4A is an example illustrating a circuit diagram of an FF, according to an embodiment, at a transistor level.

FIG. 4A illustrates a circuit diagram of an FF 20a according to an embodiment at a transistor level.

Referring to FIG. 4A, the FF 20a may include a plurality of NMOS transistors N41 to N44, a plurality of PMOS transistors P41 to P44, a keeper circuit 21a, and an inverter 22.

Referring to FIG. 1B together, the FF 20a according to an embodiment further includes a first discharge path and a first charge path. The first discharge path as an electrical path formed by the NMOS transistors N44, N43, and N41 may connect the first node ND1 to the ground line VSS to change the voltage level of the first node ND1 to "logic low". The first charge path as an electrical path formed by the PMOS transistors P44, P43, and P41 may connect the first node ND1 to a power voltage line VDD to change the voltage level of the first node ND1 to "logic high". NMOS transistors N43 and N44 may be connected to NMOS transistor N42 in parallel. PMOS transistors P43 and P44 may be connected to PMOS transistor P42 in parallel. In one example, NMOS transistor N41 is connected to the ground line VSS and is configured to operate based on the input signal D, and NMOS transistor N42 connects the first node ND1 to the first NMOS transistor N41 and is configured to operate based on the pulse signal P. In one example, the PMOS transistor P41 is connected to the power voltage line VDD and is configured to operate based on the input signal D, and the PMOS transistor P42 connects the first node ND1 to the PMOS transistor N41 and is configured to operate based on the inverted pulse signal PN inverted with respect to the pulse signal P.

The clock signal CLK may transition from "logic low" to "logic high". It is assumed that the clock signal CLK transitions to "logic high" at a point in time t=0. Because the inverted clock signal CLKN passes through the inverter 311 of FIG. 3A, a point in time at which the inverted clock signal CLKN transitions from "logic high" to "logic low" may be t=ΔD (hereinafter, t1). The inverted clock signal CLKN output from the inverter 31(n-1) of FIG. 3A may transition from "logic high" to "logic low" at a point in time t=ΔD(n-1) (hereinafter, t2). The clock signal CLK output from the inverter 31n of FIG. 3A may transition from "logic low" to "logic high" at a point in time t=ΔD(n) (hereinafter, t3). Based on that both the clock signal CLK generated by the clock generator 305 and the clock signal CLK generated by the inverter 31n are input after a point in time t=t3, the NAND logic 320 of FIG. 3A may generate the inverted pulse signal PN of "logic low" at a point in time t=t4 following a point in time t3. The inverter 330 of FIG. 3A may receive the inverted pulse signal PN from the NAND logic 320 and may invert the inverted pulse signal PN at a point in time t=t5 following a point in time t4 to output the pulse signal P.

According to an embodiment, the NMOS transistor N44 is turned on in response to the transition of the clock signal CLK to "logic high" at the point in time t=0. Then, the PMOS transistor P44 may be turned on in response to the transition of the inverted clock signal CLKN to "logic low" at a point in time t=t1. Then, the PMOS transistor P43 may be turned on in response to the transition of the inverted clock signal CLKN output from the inverter 31(n-1) to "logic low" at a point in time t=t2. That is, the first charge path may be activated at the point in time t=t2, and whether the first node ND1 is charged may vary according to a logic value of the input signal D. For example, when the input signal D is "logic low", the PMOS transistor P41 may be turned on. Because all of the PMOS transistors P44, P43, and P41 are turned on, the first node ND1 may be electrically connected to the power voltage line VDD. The voltage level of the first node ND1 may be increased by the power voltage line VDD and may transition to "logic high". The inverter 22 may invert the voltage level of the first node ND1 to output the output signal Q of "logic low".

Then, the NMOS transistor N43 may be turned on in response to the transition of the clock signal CLK output from the inverter 31n to "logic high" at the point in time t=t3. That is, the first discharge path may be activated at the point in time t=t3, and whether the first node ND1 is charged may vary according to the logic value of the input signal D. For example, when the input signal D is "logic high", the NMOS transistor N41 may be turned on. Because all of the NMOS transistors N44, N43, and N41 are turned on, the first node ND1 may be electrically connected to the ground line VSS. The first node ND1 may be discharged by the ground line VSS so that the voltage level thereof is lowered, and may transition to "logic low". The inverter 22 may invert the voltage level of the first node ND1 to output the output signal Q of "logic high".

According to an embodiment, because the inverted pulse signal PN is generated at the point in time t4 and the pulse signal P is generated at a point in time t5, the NMOS transistor N42 connecting the first node ND1 to the ground line VSS may be turned on at the point in time t5 to generate the second discharge path, and the PMOS transistor P42 connecting the first node ND1 to the power voltage line VDD may be turned on at the point in time t4 to generate the second charge path. That is, compared to the FF 10 of FIG. 1B, because the first discharge path or the first charge path is activated before the second discharge path is activated by the pulse signal P or the second charge path is activated by the inverted pulse signal PN so that the voltage level of the first node ND1 is charged or discharged, the CQ delay from "logic high" of the clock signal CLK to "logic high" of the output signal Q may be greatly reduced. In one example, when the input signal is logic high, before the second NMOS transistor N42 is turned on to form a second discharge path in response to transition of the pulse signal P to logic high, the third NMOS transistor N43 and the fourth NMOS transistor N44 are configured to be turned on to form an electrical connection from the first node ND1 to the ground line VSS and to lower the voltage level of the first node ND1.

In one example, the second discharge path corresponds to an electrical path from the first node ND1 to the second NMOS transistor N42 and the first NMOS transistor N41, and, when the input signal is logic high, the first discharge path corresponds to an electrical path from the first node ND1 to the third NMOS transistor N43, the fourth NMOS transistor N44, and the first NMOS transistor N41.

The following table illustrates the CQ delay reduced by adding the first charge path and the first discharge path activated based on the clock signal CLK and the inverted clock signal CLKN.

TABLE 1

|  | CLK to Q rise | CLK to Q fall |
|---|---|---|
| a degree of reduction in the CQ delay | 25% reduction | 10% reduction |

According to the above table, a time taken for the clock signal CLK to transition to "logic high" and the output signal Q to transition to "logic high" may be reduced by 25%, and a time taken for the clock signal CLK to transition to "logic low" and the output signal Q to transition to "logic low" may be reduced by 10%.

Figure 4B:
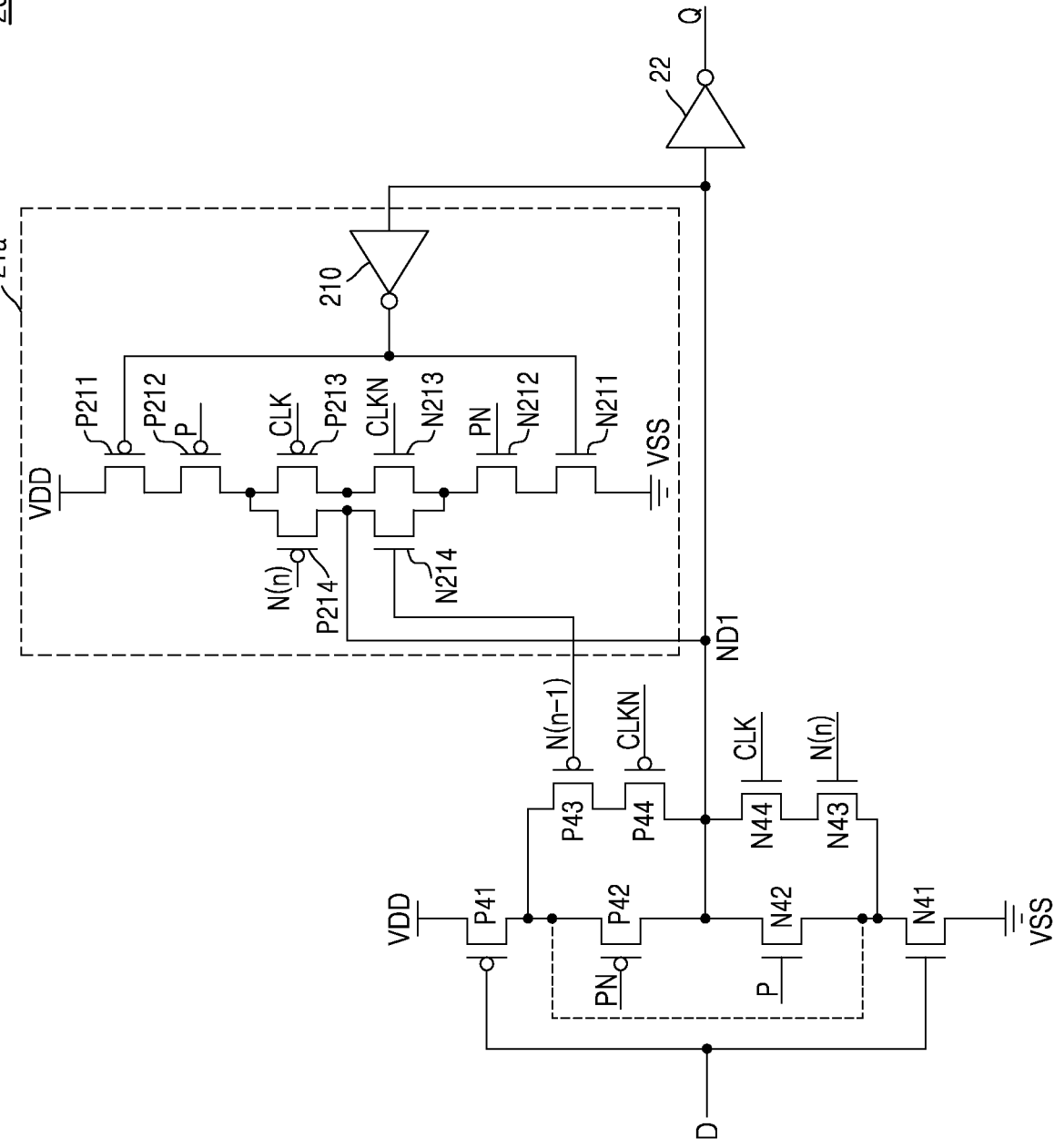
FIG. 4B is another example illustrating a circuit diagram of an FF and a keeper circuit, according to an embodiment, at a transistor level.

FIG. 4B is another example illustrating a circuit diagram of an FF and a keeper circuit 21a according to embodiments at a transistor level. In one example, the FF shown in FIG. 4B is the FF 20a shown in FIG. 4A, but with additional detail of the keeper circuit 21a provided.

Referring to FIG. 4B, the keeper circuit 21a may include an inverter 210, a plurality of PMOS transistors P211 to P214, and a plurality of NMOS transistors N211 to N214. The plurality of NMOS transistors N211 to N214 and the plurality of PMOS transistors P211 to P214 may form a partially modified tri-state inverter.

The inverter 210 may invert a logic level of the first node ND1 to provide the inverted logic level to the modified tri-state inverter. For example, the logic level of the first node ND1, which is inverted by the inverter 210, may be input to gates of the PMOS transistor P211 and the NMOS transistor N211. When the first node ND1 is "logic high," the NMOS transistor N211 may be turned on, and when the first node ND1 is "logic low," the PMOS transistor P211 may be turned on. That is, only one of the NMOS transistor N211 and the PMOS transistor P211 may be turned on according to the logic level of the first node ND1.

The PMOS transistor P211, the PMOS transistor P212, the PMOS transistor P213, the NMOS transistor N213, the NMOS transistor N212, and the NMOS transistor N211 may be serially connected to one another. The PMOS transistor P212 may receive the pulse signal P through a gate thereof. The PMOS transistor P213 may receive the clock signal CLK through a gate thereof. The NMOS transistor N213 may receive the inverted clock signal CLKN through a gate thereof. The NMOS transistor N212 may receive the inverted pulse signal PN through a gate thereof. The PMOS transistor P214 may receive a signal N(n) output from the nth inverter 31n of the clock and pulse generator 310a of FIG. 3A through a gate thereof. The signal N(n) output from the nth inverter 31n may have the same logic level as the clock signal CLK. The NMOS transistor N214 may receive a signal N(n-1) output from the (n-1)th inverter 31(n-1) of the clock and pulse generator 310a of FIG. 3A through a gate thereof. The signal N(n-1) output from the (n-1)th inverter 31(n-1) may have the same logic level as the inverted clock signal CLKN.

According to an embodiment, after the pulse signal P transitions to "logic high" according to the "logic high" of the clock signal CLK, the clock signal CLK may transition to "logic low" again. The clock signal CLK may transition to "logic low" so that the output signal N(n) of the nth inverter 31n may transition to "logic low" and the output signal N(n-1) of the (n-1)th inverter 31(n-1) may transition to "logic high". That is, when the clock signal CLK transitions to "logic low", the PMOS transistor P214 and the NMOS transistor N214 may be turned on.

Although the clock signal CLK transitions to "logic low", the pulse signal P may still be "logic high" due to the CQ delay. That is, the pulse signal P applied to the PMOS transistor P212 may be "logic high", the clock signal CLK applied to the PMOS transistor P213 may be "logic low", the inverted clock signal CLKN applied to the NMOS transistor N213 may be "logic high", and the inverted pulse signal PN applied to the NMOS transistor N212 may be "logic low". In an embodiment, only the PMOS transistor P213 and the NMOS transistor N213 are turned on in a CQ delay period in which only the clock signal CLK transitions to "logic low" and the pulse signal P is still "logic high."

According to an embodiment, at a point in time after the CQ delay has elapsed, both the clock signal CLK and the pulse signal P transition to "logic low". Therefore, both the PMOS transistors P212 and P213 and the NMOS transistors N212 and N213 may be turned on. When both PMOS transistors P212 and P213 and the NMOS transistors N212 and N213 are turned on, an output of the tri-state inverter may be fed back to the first node ND1 according to either the NMOS transistor N211 or the PMOS transistor P211 turned on based on the logic level of the first node ND1. For example, when the first node ND1 is "logic high," the PMOS transistor P211 may be turned on so that the power voltage line VDD may be electrically connected to the first node ND1 and the "logic high" of the first node ND1 may be maintained. In another example, when the first node ND1 is "logic low," the NMOS transistor N211 may be turned on so that the ground line VSS may be electrically connected to the first node ND1 and the "logic low" of the first node ND1 may be maintained.

Figure 5A:
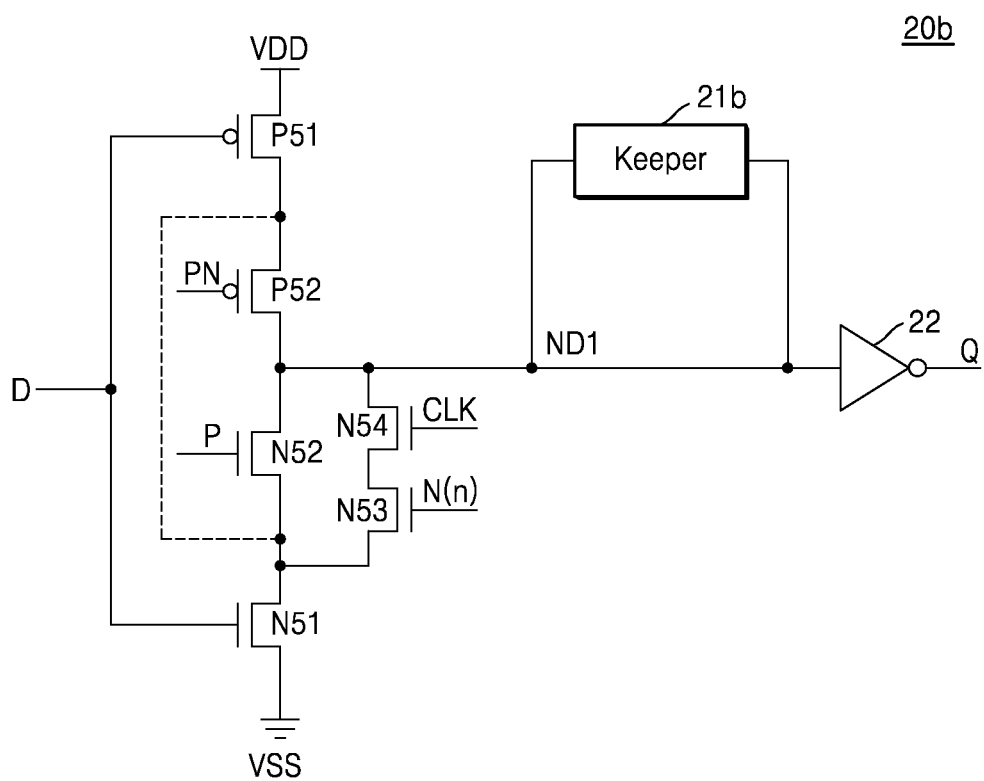
FIG. 5A is an example illustrating a circuit diagram of an FF including only a first discharge path, according to an embodiment, at a transistor level.

FIG. 5A is an example illustrating a circuit diagram of an FF 20b including only a first discharge path according to an embodiment at a transistor level.

Referring to FIG. 5A, the FF 20b may include a plurality of NMOS transistors N51 to N54, a plurality of PMOS transistors P51 and P52, a keeper circuit 21b, and an inverter 22. The plurality of NMOS transistors N51 to N54 of FIG. 5A may correspond to the plurality of NMOS transistors N41 to N44 of FIG. 4A. The plurality of PMOS transistors P51 and P52 of FIG. 5A may correspond to the plurality of PMOS transistors P41 and P42 of FIG. 4A.

Referring to FIG. 1B together, the FF 20b according to an embodiment further includes a first discharge path. The first discharge path is an electrical path formed by the NMOS transistors N54, N53, and N51 may connect the first node ND1 to the ground line VSS.

The clock signal CLK may transition from "logic low" to "logic high". It is assumed that the clock signal CLK transitions to "logic high" at a point in time t=0. Because the inverted clock signal CLKN passes through the inverter 311 of FIG. 3A, a point in time at which the inverted clock signal CLKN transitions from "logic high" to "logic low" may be t=ΔD (hereinafter, t1). The inverted clock signal CLKN output from the inverter 31(n-1) of FIG. 3A may transition from "logic high" to "logic low" at a point in time t=ΔD (n-1) (hereinafter, t2). The clock signal CLK output from the inverter 31n of FIG. 3A may transition from "logic low" to "logic high" at a point in time t=ΔD(n) (hereinafter, t3).

According to an embodiment, the NMOS transistor N54 is turned on in response to the transition of the clock signal CLK to "logic high" at the point in time t=0. Then, the NMOS transistor N53 may be turned on in response to the transition of the clock signal CLK output from the inverter 31n to "logic high" at the point in time t=t3. That is, the first discharge path may be activated at the point in time t=t3, and the voltage level of the first node ND1 may vary according to the logic value of the input signal D.

For example, when the input signal D is "logic low", the NMOS transistor N51 may be turned off. Therefore, the first node ND1 is not electrically connected to the ground line VSS, and the voltage level of the first node ND1 may not be lowered. When the input signal D is "logic high", the NMOS transistor N51 may be turned on. Therefore, because the first node ND1 is electrically connected to the ground line VSS, the voltage level of the first node ND1 may be lowered. When the voltage level of the first node ND1 is lowered, the inverter 22 may invert the voltage level of the first node ND1 to output an output signal Q of "logic high". For example, the inverter 22 may invert a signal at the first node ND1 to output the output signal Q.

According to the above-described embodiments, it may be noted that the PMOS transistors P44 and P43 constituting the first charge path of FIG. 4A are excluded (or omitted) from the FF 20b to selectively activate only the transition of the output signal Q to "logic high" with a large amount of reduction in CQ delay. That is, it may be noted that, because the effect of reducing the delay of the transition of the output signal Q to "logic high" is great, the NMOS transistors N54 and N53 of the first discharge path for lowering the voltage level of the first node ND1 are maintained. Instead of giving up the transition of the output signal Q to "logic low" with a small amount of reduction in CQ delay, by excluding (or omitting) the PMOS transistors P44 and P43, the FF 20b may be miniaturized and power consumption of the FF 20b may be reduced.

Figure 5B:
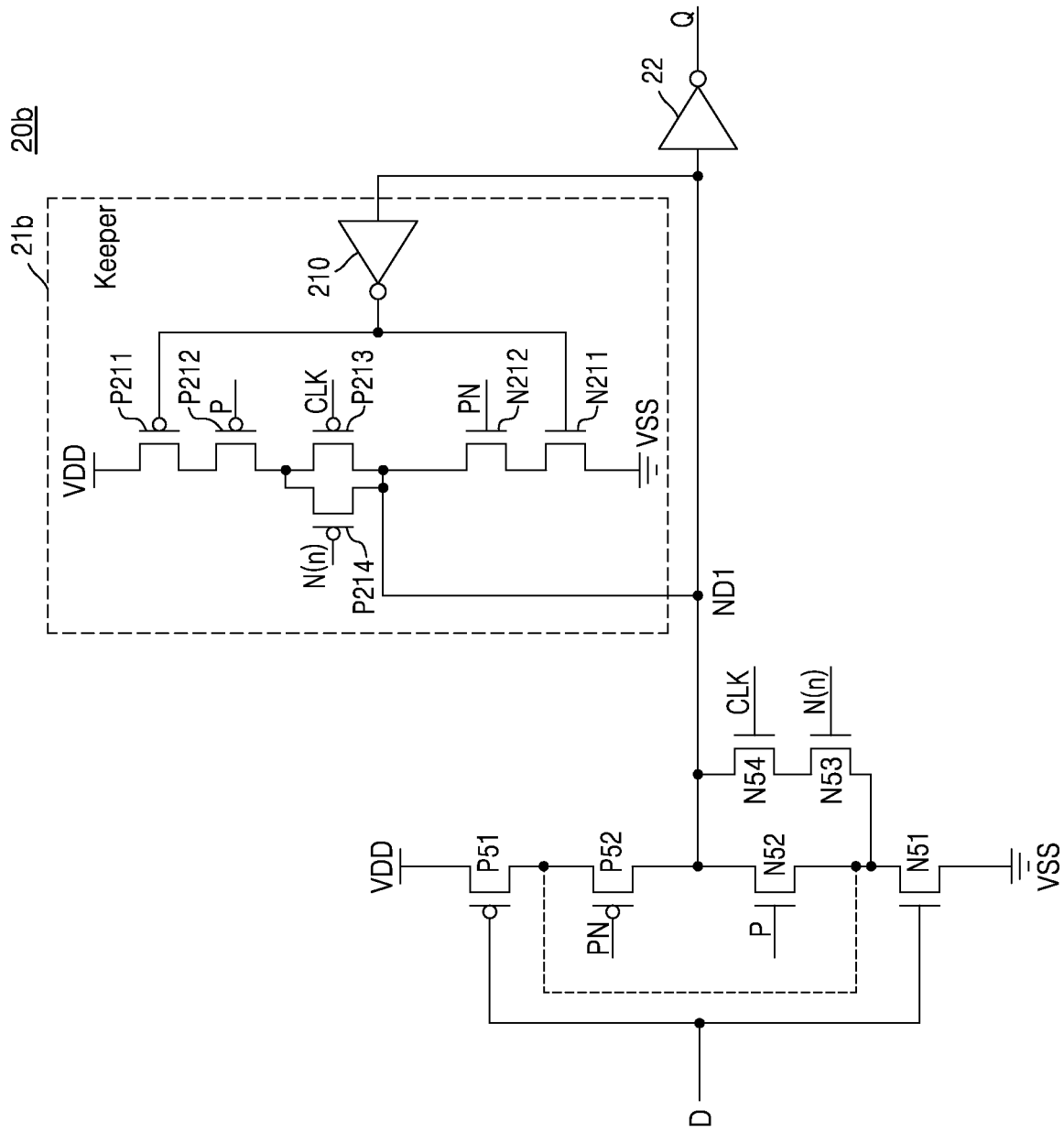
FIG. 5B is another example illustrating a circuit diagram of an FF including only a first discharge path and a keeper circuit, according to an embodiment, at a transistor level.

Referring to FIG. 5B, the keeper circuit 21b may be obtained by excluding (or omitting) the NMOS transistors N213 and N214 of the keeper circuit 21a of FIG. 4B. That is, because the PMOS transistors P44 and P43 forming the first charge path are excluded (or omitted), the NMOS transistors N213 and N214 receiving the same signals as signals applied to the PMOS transistors P43 and P44 may be excluded (or omitted).

Figure 6A:
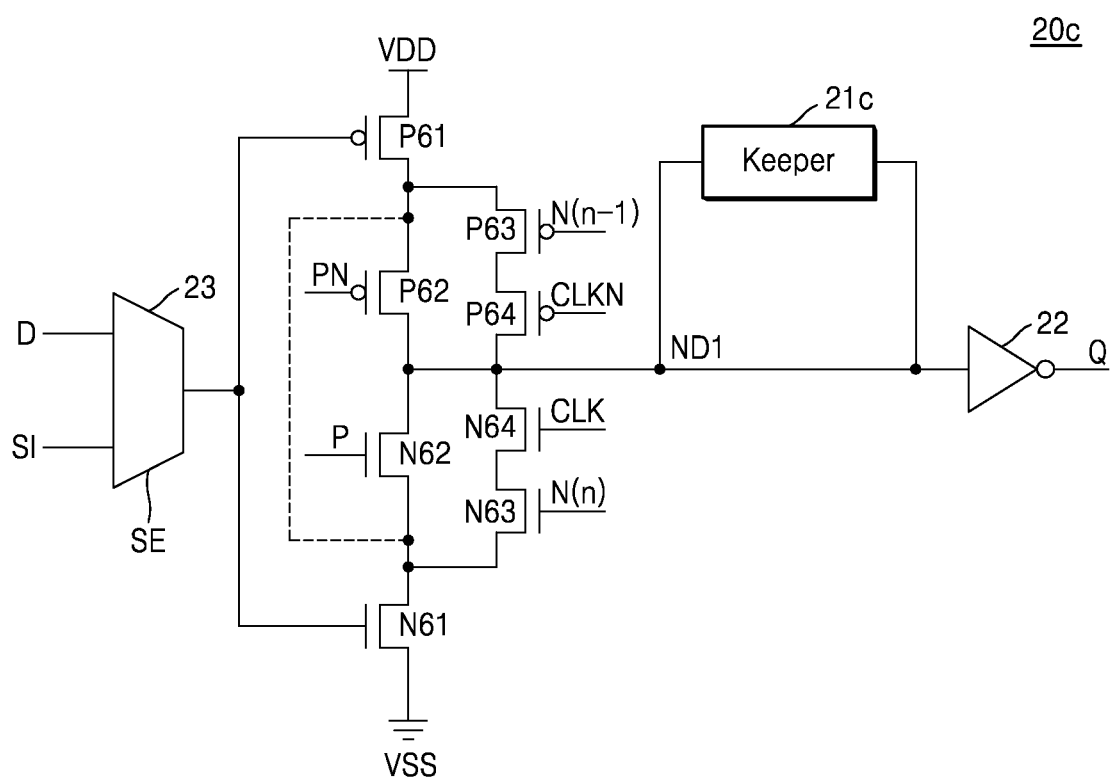
FIG. 6A is an example illustrating a circuit diagram of an FF including a scan multiplexer and a keeper circuit, according to an embodiment, at a transistor level.

FIG. 6A illustrates a circuit diagram of an FF 20c according to an embodiment at a transistor level.

Referring to FIG. 6A, the FF 20c may include a plurality of NMOS transistors N61 to N64, a plurality of PMOS transistors P61 to P64, a keeper circuit 21c, an inverter 22, and a scan multiplexer 23. That is, the FF 20c of FIG. 6A may be obtained by adding only the scan multiplexer 23 to the FF 20a of FIG. 4A.

The NMOS transistor N61 and the PMOS transistor P61 may receive an output of the scan multiplexer 23. For example, the output of the scan multiplexer 23 may be provided to gates of the NMOS transistor N61 and the PMOS transistor P61. NMOS transistor N61 may be configured to operate based on an output signal of the scan multiplexer 23, and PMOS transistor P61 may be configured to operate based on an output signal of the scan multiplexer 23. In one example, the input signal D described with reference to FIG. 4A on which the first NMOS transistor N41 and first PMOS transistor P41 are configured to operate can be considered to correspond to an output of the scan multiplexer 23, on which the first NMOS transistor N61 and the first PMOS transistor P61 are configured to operate. Said another way, the input signal may correspond to the output signal of the scan multiplexer 23.

The scan multiplexer 23 may provide an inverted value of the input signal D or an inverted value of a scan input SI to the FF 20c according to a logic value of a scan enable signal SE. For example, when the scan enable signal SE is "logic low", the scan multiplexer 23 may transmit the inverted value of the input signal D to the gates of the NMOS transistor N61 and the PMOS transistor P61 of the FF 20c. In another example, when the scan enable signal SE is "logic high", the scan multiplexer 23 may transmit the inverted value of the scan input SI to the gates of the NMOS transistor N61 and the PMOS transistor P61 of the FF 20c. In one example, the scan multiplexer 23 configured to selectively output either an input signal or a scan signal.

Referring to FIG. 1B together, the FF 20c according to an embodiment further includes a first discharge path and a first charge path activated according to a clock signal CLK and an inverted clock signal CLKN. The first discharge path as an electrical path formed by the NMOS transistors N64, N63, and N61 may connect the first node ND1 to the ground line VSS. The first charge path as an electrical path formed by the PMOS transistors P64, P63, and P61 may connect the first node ND1 to the power voltage line VDD.

The clock signal CLK may transition from "logic low" to "logic high". It is assumed that the clock signal CLK transitions to "logic high" at a point in time t=0. Because the inverted clock signal CLKN passes through the inverter 311 of FIG. 3A, a point in time at which the inverted clock signal CLKN transitions from "logic high" to "logic low" may be t=ΔD (hereinafter, t1). The inverted clock signal CLKN output from the inverter 31(n-1) of FIG. 3A may transition from "logic high" to "logic low" at a point in time t=ΔD(n-1) (hereinafter, t2). The clock signal CLK output from the inverter 31n of FIG. 3A may transition from "logic low" to "logic high" at a point in time t=ΔD(n) (hereinafter, t3).

According to an embodiment, the NMOS transistor N64 is turned on in response to the transition of the clock signal CLK to "logic high" at the point in time t=0. Then, the PMOS transistor P64 may be turned on in response to the transition of the inverted clock signal CLKN to "logic low" at a point in time t=t1. Then, the PMOS transistor P63 may be turned on in response to the transition of the inverted clock signal CLKN output from the inverter 31(n-1) to "logic low" at a point in time t=t2. That is, the first charge path may be activated at the point in time t=t2, and whether the first node ND1 is charged may vary according to a logic value of a signal input to the gates of the NMOS transistor N61 and the PMOS transistor P61 of the FF 20c. For example, when the input signal D provided to the scan multiplexer 23 at the point in time t=t2 is "logic high" and the scan enable signal SE is "logic low," the signal input to the gates of the NMOS transistor N61 and the PMOS transistor P61 may be "logic low," which is an inverted signal of the input signal D. The PMOS transistor P61 may be turned on based on the signal of "logic low". Because all of the PMOS transistors P64, P63, and P61 are turned on, the first node ND1 may be electrically connected to the power voltage line VDD. The voltage level of the first node ND1 may be increased by the power voltage line VDD and may transition to "logic high". The inverter 22 may invert the voltage level of the first node ND1 to output the output signal Q of "logic low".

Then, the NMOS transistor N63 may be turned on in response to the transition of the clock signal CLK output from the inverter 31n to "logic high" at the point in time t=t3. That is, the first discharge path may be activated at the point in time t=t3, and whether the first node ND1 is charged may vary according to the logic value of the input signal D. When it is still assumed that the input signal D is "logic high", because the signal input to the gate of the NMOS transistor N61 is "logic low", which is the inverted signal of the input signal D, the NMOS transistor N61 may be turned off. Therefore, the first node ND1 is not electrically connected to the ground line VSS, and the voltage level of the first node ND1 may not be lowered.

Figure 6B:
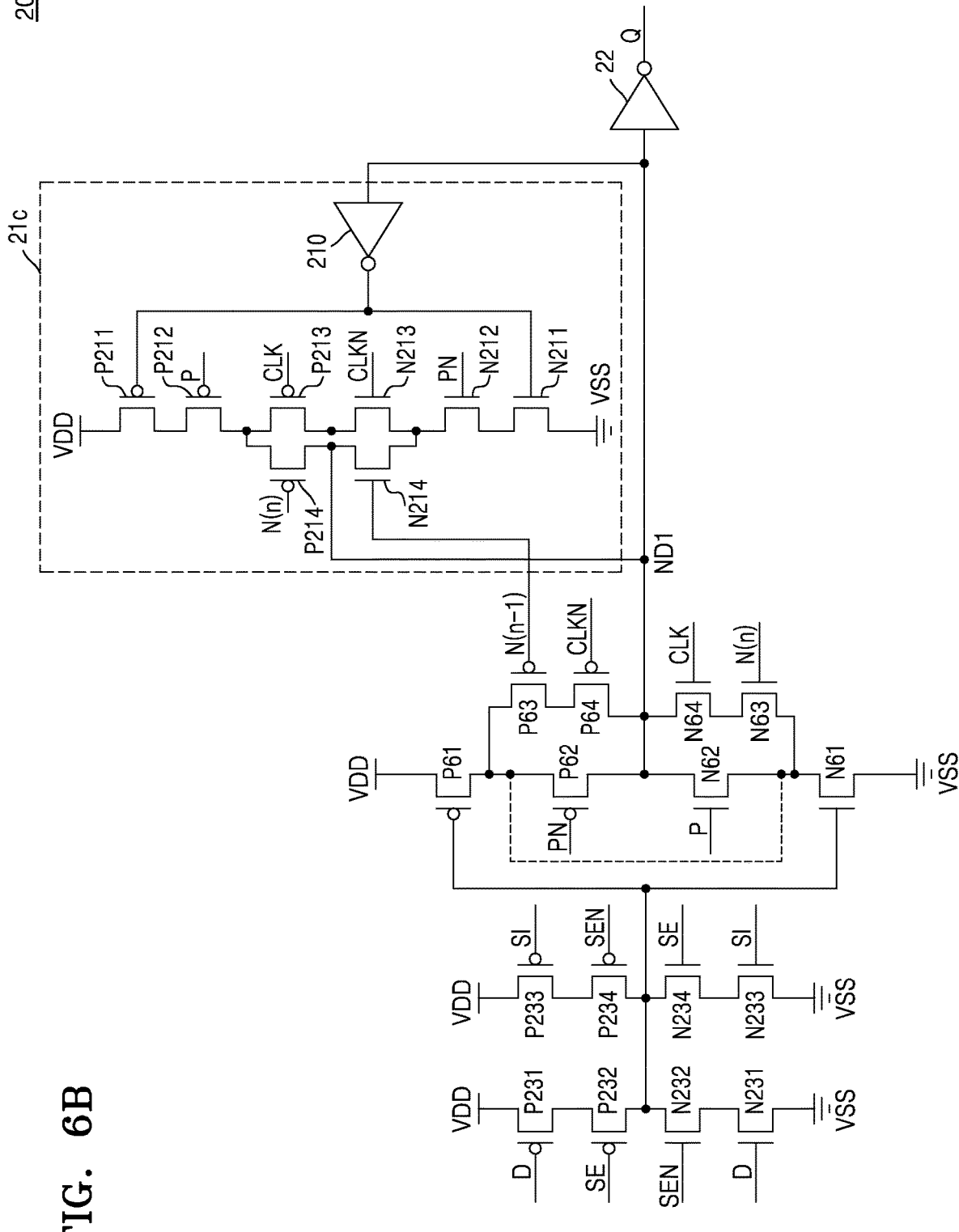
FIG. 6B is another example illustrating a circuit diagram of an FF including a scan multiplexer and a keeper circuit, according to an embodiment, at a transistor level.

Referring to FIG. 6B, the scan multiplexer 23 may include a plurality of NMOS transistors N231 to N234 and a plurality of PMOS transistors P231 to P234. The power voltage line VDD may be connected to the PMOS transistor P231. The PMOS transistor P231, the PMOS transistor P232, the NMOS transistor N232, and the NMOS transistor N231 may be serially connected to one another. The NMOS transistor N231 may be connected to the ground line VSS. The PMOS transistor P231 may receive the input signal D through a gate thereof, the PMOS transistor P232 may receive the scan enable signal SE through a gate thereof, the NMOS transistor N232 may receive an inverted scan enable signal SEN through a gate thereof, and the NMOS transistor N231 may receive the input signal D through a gate thereof. The inverted scan enable signal SEN may be generated by inverting the scan enable signal SE.

The power voltage line VDD may be connected to the PMOS transistor P233. The PMOS transistor P233, the PMOS transistor P234, the NMOS transistor N234, and the NMOS transistor N233 may be serially connected to one another. The NMOS transistor N233 may be connected to the ground line VSS. The PMOS transistor P233 may receive the scan input SI through a gate thereof, the PMOS transistor P234 may receive the inverted scan enable signal SEN through a gate thereof, the NMOS transistor N234 may receive the scan enable signal SE through a gate thereof, and the NMOS transistor N231 may receive the scan input SI through a gate thereof.

When the scan enable signal SE is "logic high", the PMOS transistor P232 may be turned off and the NMOS transistor N234 may be turned on. Because the inverted scan enable signal SEN is "logic low", the NMOS transistor N232 may be turned off and the PMOS transistor P234 may be turned on. That is, when the scan enable signal SE is "logic high," either the power voltage line VDD or the ground line VSS may be applied to the NMOS transistor N61 or the PMOS transistor P61 according to a logic level of the scan input SI.

When the scan enable signal SE is "logic low", the PMOS transistor P232 may be turned on and the NMOS transistor N234 may be turned off. Because the inverted scan enable signal SEN is "logic high", the NMOS transistor N232 may be turned on and the PMOS transistor P234 may be turned off. That is, when the scan enable signal SE is "logic low," either the power voltage line VDD or the ground line VSS may be applied to the NMOS transistor N61 and the PMOS transistor P61 according to a logic level of the input signal D.

Figure 7A:
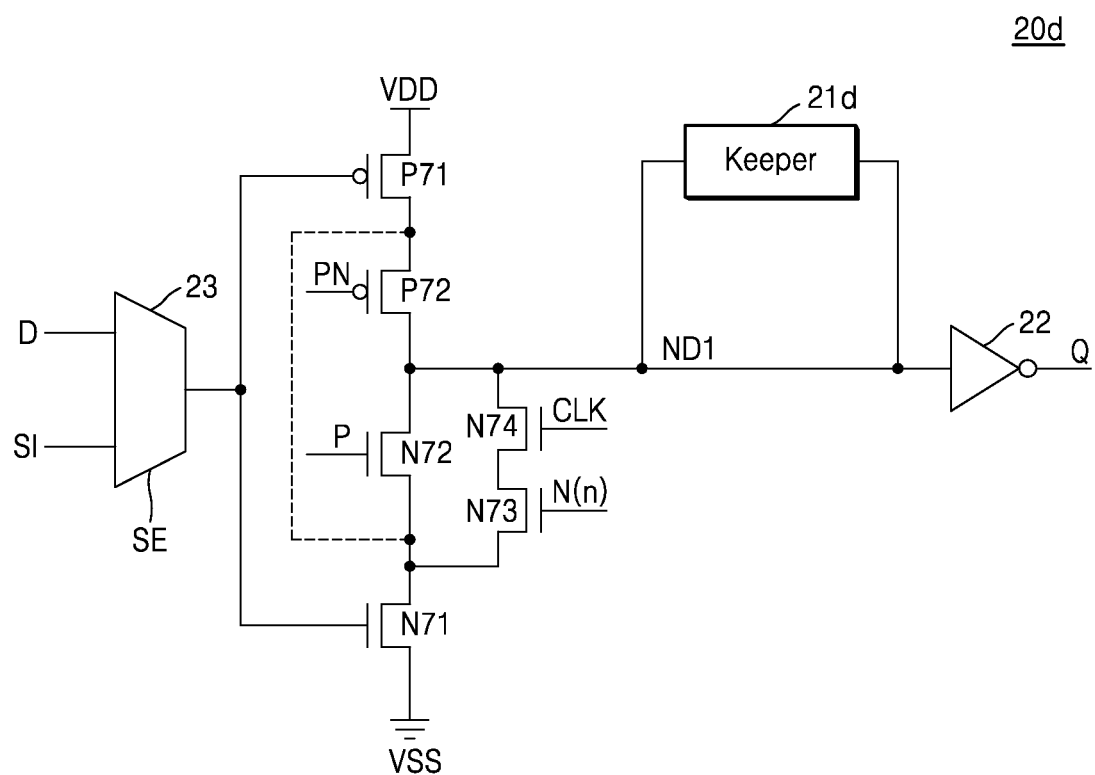
FIG. 7A is an example illustrating a circuit diagram of an FF including a scan multiplexer and a keeper circuit, according to an embodiment, at a transistor level.

FIG. 7A illustrates a circuit diagram of an FF 20d according to an embodiment at a transistor level.

Referring to FIG. 7A, the FF 20d may include a plurality of NMOS transistors N71 to N74, a plurality of PMOS transistors P71 and P72, a keeper circuit 21d, an inverter 22, and a scan multiplexer 23. Compared with FIG. 6, the FF 20d may be obtained by excluding (or omitting) the two PMOS transistors P64 and P63 for activating the first charge path from the FF 20c of FIG. 6A.

Referring to FIG. 1B together, the FF 20d according to an embodiment further includes a first discharge path. The first discharge path as an electrical path formed by the NMOS transistors N74, N73, and N71 may connect the first node ND1 to the ground line VSS.

The clock signal CLK may transition from "logic low" to "logic high". It is assumed that the clock signal CLK transitions to "logic high" at a point in time t=0. Because the inverted clock signal CLKN passes through the inverter 311 of FIG. 3A, a point in time at which the inverted clock signal CLKN transitions from "logic high" to "logic low" may be t=ΔD (hereinafter, t1). The inverted clock signal CLKN output from the inverter 31(n-1) of FIG. 3A may transition from "logic high" to "logic low" at a point in time t=ΔD(n-1) (hereinafter, t2). The clock signal CLK output from the inverter 31n of FIG. 3A may transition from "logic low" to "logic high" at a point in time t=ΔD(n) (hereinafter, t3).

According to an embodiment, the NMOS transistor N74 is turned on in response to the transition of the clock signal CLK to "logic high" at the point in time t=0. Then, the NMOS transistor N73 may be turned on in response to the transition of the clock signal CLK output from the inverter 31n to "logic high" at the point in time t=t3. That is, the first discharge path may be activated at the point in time t=t3, and the voltage level of the first node ND1 may vary according to a signal input to a gate of the NMOS transistor N71. For example, when the input signal D provided to the scan multiplexer 23 is "logic high", the signal provided to the gate of the NMOS transistor N71 may be "logic low". The NMOS transistor N71 may be turned off based on the gate signal of "logic low". Therefore, the first node ND1 is not electrically connected to the ground line VSS, and the voltage level of the first node ND1 may not be lowered. In another example, when the input signal D provided to the scan multiplexer 23 is "logic low", the signal provided to the gate of the NMOS transistor N71 may be "logic high". The NMOS transistor N71 may be turned on based on the gate signal of "logic high". Therefore, the first node ND1 may be electrically connected to the ground line VSS, and the voltage level of the first node ND1 may be lowered. When the voltage level of the first node ND1 is lowered, the inverter 22 may invert the voltage level of the first node ND1 to output an output signal Q of "logic high".

Figure 7B:
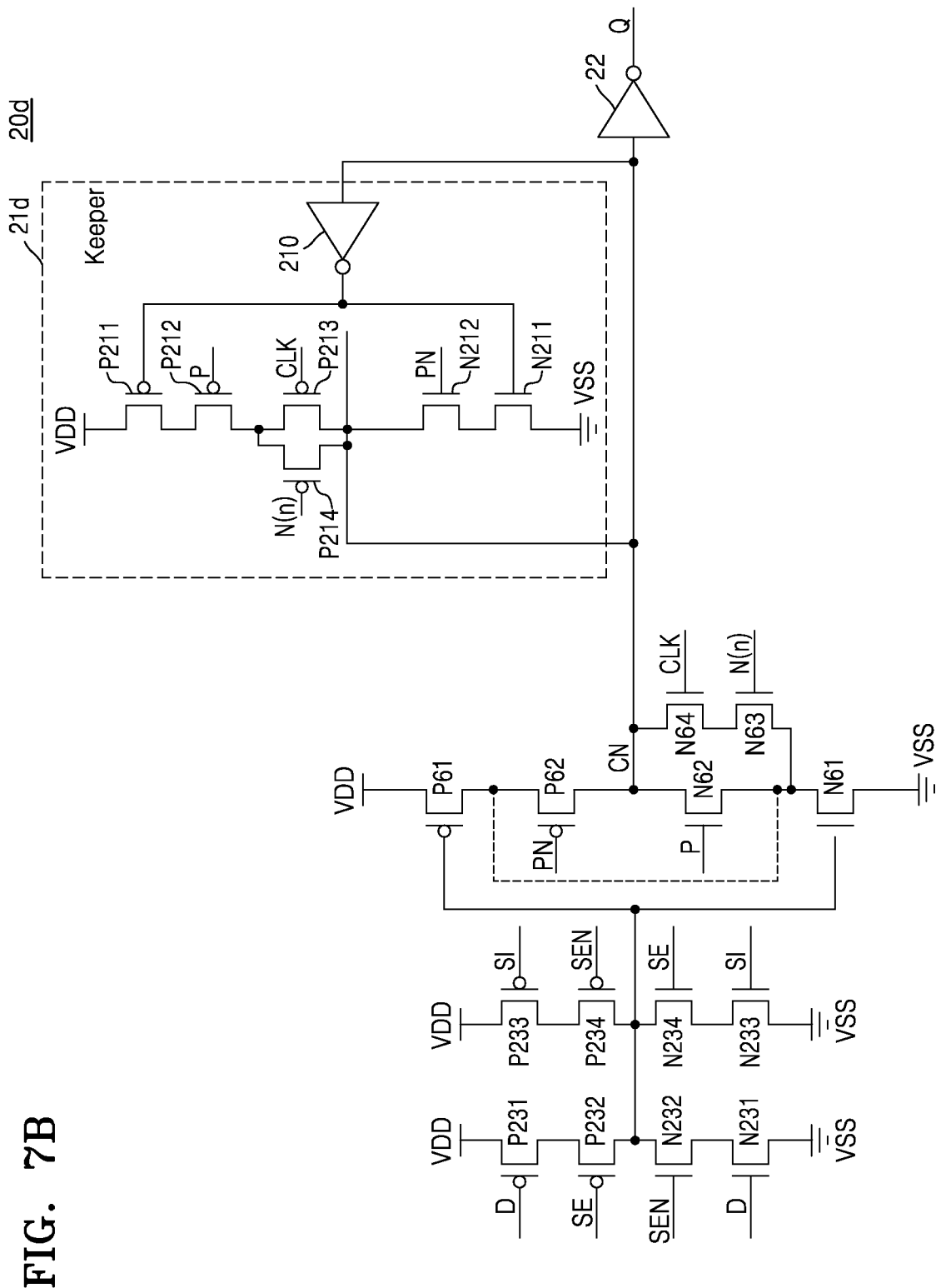
FIG. 7B is another example illustrating a circuit diagram of an FF including a scan multiplexer and a keeper circuit, according to an embodiment, at a transistor level.

Referring to FIG. 7B, the keeper circuit 21d may be obtained by excluding (or omitting) the NMOS transistors N213 and N214 of the keeper circuit 21c of FIG. 6B. That is, because the PMOS transistors P64 and P63 forming the first charge path are excluded (or omitted), the NMOS transistors N213 and N214 receiving the same signals as signals applied to the PMOS transistors P63 and P64 may be excluded (or omitted).

Figure 8:
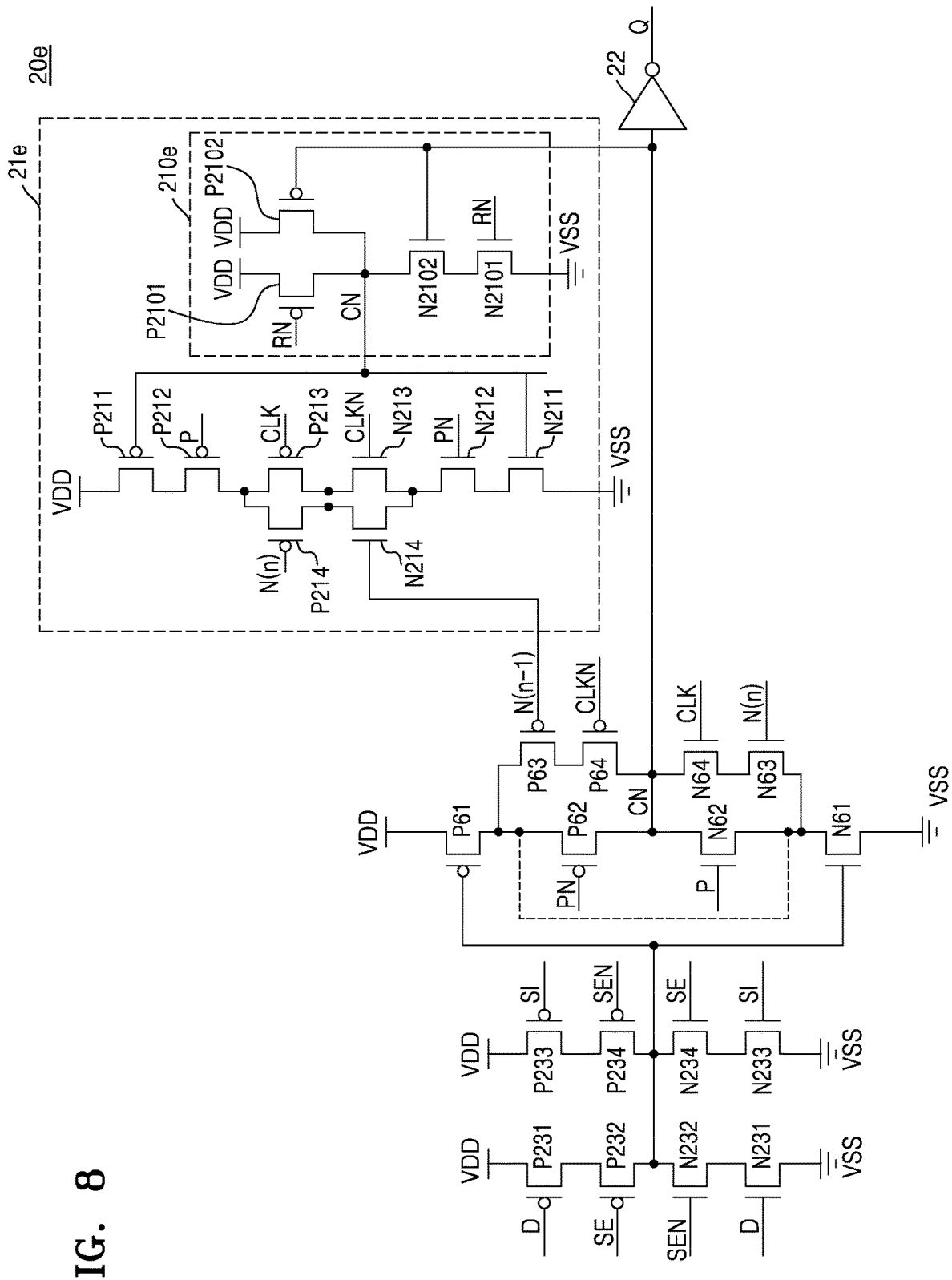
FIG. 8 is an example illustrating a circuit diagram of an FF including a scan multiplexer, according to an embodiment, at a transistor level.

FIG. 8 illustrates a circuit diagram of an FF 20e according to embodiment at a transistor level.

Referring to FIG. 8, the FF 20e may operate based on an inverted reset signal RN. The inverted reset signal RN may correspond to a signal for inverting a reset signal. The clock and pulse generator 310a of FIG. 3A may further include an additional inverter for receiving the reset signal and inverting the reset signal to output the inverted reset signal RN. The reset signal may be for asynchronously initializing the first node ND1.

Referring to FIG. 6B together, the FF 20e of FIG. 8 may further include an inverter 210e in a keeper circuit 21e. The inverter 210e may include PMOS transistors P2101 and P2102 and NMOS transistors N2101 and N2102. The PMOS transistor P2101 may be connected to the power voltage line VDD and may receive the inverted reset signal RN through a gate thereof. The PMOS transistor P2102 may be connected to the power voltage line VDD and may receive the logic level of the first node ND1 through a gate thereof. The NMOS transistor N2102 may receive the logic level of the first node ND1 through a gate thereof, and may be connected to the PMOS transistors P2101 and P2102 through a common node CN. The NMOS transistor N2101 may be connected to the ground line VSS and may receive the inverted reset signal RN through a gate thereof. When the reset signal is "logic low", the inverted reset signal RN is "logic high". The NMOS transistor N2101 may be turned on based on the inverted reset signal RN of "logic high" to connect the ground line VSS to the NMOS transistor N2102. The PMOS transistor P2101 may be turned off based on the inverted reset signal RN of "logic high". Therefore, according to the logic level of the first node ND1, either the NMOS transistor N2102 or the PMOS transistor P2102 may be turned on so that the inverted reset signal RN may be input to the PMOS transistor P211 and the NMOS transistor N211 of the tri-state inverter through the common node CN.

When the reset signal is "logic high", the inverted reset signal RN is "logic low". That is, when the reset is to be asynchronously performed, the inverted reset signal RN may be "logic high". The NMOS transistor N2101 may be turned off based on the inverted reset signal RN of "logic low". The PMOS transistor P2101 may be turned on based on the inverted reset signal RN of "logic low". Therefore, the power voltage line VDD may be connected to a common node CN. That is, in response to initialization, the logic level of "logic high" may be input to the PMOS transistor P211 and the NMOS transistor N211 of the tri-state inverter regardless of the logic level of the first node ND1.

Figure 9:
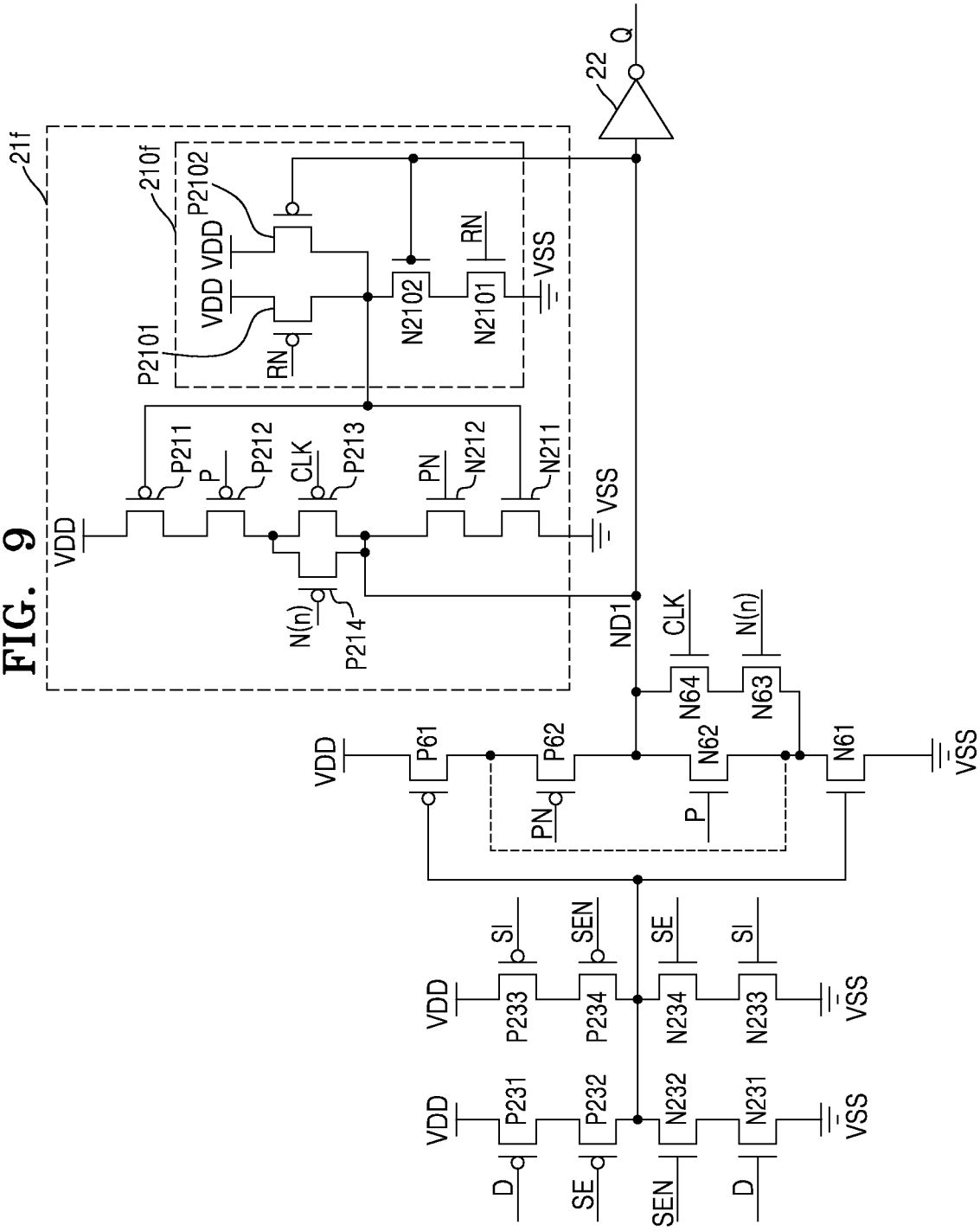
FIG. 9 is another example illustrating a circuit diagram of an FF including a scan multiplexer, according to an embodiment, at a transistor level.

FIG. 9 illustrates a circuit diagram of an FF 20f according to an embodiment at a transistor level.

Referring to FIG. 9, the FF 20f may operate based on an inverted reset signal RN. The inverted reset signal RN may correspond to a signal for inverting a reset signal. The clock and pulse generator 310a of FIG. 3A may further include an additional inverter for receiving the reset signal and inverting the reset signal to output the inverted reset signal RN. The reset signal may be for asynchronously initializing the first node ND1.

Referring to FIG. 7B together, the FF 20f of FIG. 9 may further include an inverter 210f in a keeper circuit 21f. The inverter 210f may include PMOS transistors P2101 and P2102 and NMOS transistors N2101 and N2102. The PMOS transistor P2101 may be connected to the power voltage line VDD and may receive the inverted reset signal RN through a gate thereof. The PMOS transistor P2102 may be connected to the power voltage line VDD and may receive the logic level of the first node ND1 through a gate thereof. The NMOS transistor N2102 may receive the logic level of the first node ND1 through a gate thereof, and may be connected to the PMOS transistors P2101 and P2102 through a common node CN. The NMOS transistor N2101 may be connected to the ground line VSS and may receive the inverted reset signal RN through a gate thereof.

When the reset signal is "logic low", the inverted reset signal RN is "logic high". The NMOS transistor N2101 may be turned on based on the inverted reset signal RN of "logic high" to connect the ground line VSS to the NMOS transistor N2102. The PMOS transistor P2101 may be turned off based on the inverted reset signal RN of "logic high". Therefore, according to the logic level of the first node ND1, either the NMOS transistor N2102 or the PMOS transistor P2102 may be turned on so that the inverted reset signal RN may be input to the PMOS transistor P211 and the NMOS transistor N211 of the tri-state inverter through the common node CN.

When the reset signal is "logic high", the inverted reset signal RN is "logic low". That is, when the reset is to be asynchronously performed, the inverted reset signal RN may be "logic high". The NMOS transistor N2101 may be turned off based on the inverted reset signal RN of "logic low". The PMOS transistor P2101 may be turned on based on the inverted reset signal RN of "logic low". Therefore, the power voltage line VDD may be connected to the common node CN. That is, in response to initialization, the logic level of "logic high" may be input to the PMOS transistor P211 and the NMOS transistor N211 of the tri-state inverter regardless of the logic level of the first node ND1.

While the inventive concept has been particularly shown and described with reference to embodiments thereof, it will be understood that various changes in form and details may be made therein without departing from the spirit and scope of the following claims.

What is claimed is:

1. A flip-flop (FF) comprising:
   a first n-channel metal oxide semiconductor (NMOS) transistor connected to a ground line and operating based on an input signal;
   a first p-channel metal oxide semiconductor (PMOS) transistor connected to a power voltage line and operating based on the input signal;
   a second NMOS transistor connecting a first node to the first NMOS transistor and operating based on a pulse signal;
   a second PMOS transistor connecting the first node to the first PMOS transistor and operating based on an inverted pulse signal inverted with respect to the pulse signal;
   a third NMOS transistor and a fourth NMOS transistor, connected to the second NMOS transistor in parallel, and forming a first discharge path for connecting the first node to the ground line, based at least on a clock signal;
   a third PMOS transistor and a fourth PMOS transistor, connected to the second PMOS transistor in parallel, and forming a first charge path for connecting the first node to the power voltage line, based at least on an inverted clock signal inverted with respect to the clock signal;
   a keeper circuit connected to the first node to maintain a voltage level of the first node; and
   an inverter generating an output signal by inverting a signal at the first node.

2. The FF of claim 1, wherein the third NMOS transistor connects the first node to the fourth NMOS transistor and operates based on the clock signal, and
   wherein the fourth NMOS transistor connects the first NMOS transistor to the third NMOS transistor and operates based on a signal having the same logic level as the clock signal and delayed as compared to the clock signal.

3. The FF of claim 2, wherein the clock signal and the signal delayed as compared to the clock signal are each generated before the pulse signal.

4. The FF of claim 3, wherein, when the input signal is logic high, before the second NMOS transistor is turned on to form a second discharge path in response to transition of the pulse signal to logic high, the third NMOS transistor and the fourth NMOS transistor are turned on to form an electrical connection from the first node to the ground line and to lower the voltage level of the first node.

5. The FF of claim 4, wherein the second discharge path corresponds to an electrical path from the first node to the second NMOS transistor and the first NMOS transistor, and
   wherein, when the input signal is logic high, the first discharge path corresponds to an electrical path from the first node to the third NMOS transistor, the fourth NMOS transistor, and the first NMOS transistor.

6. The FF of claim 1, wherein the third PMOS transistor connects the first node to the fourth PMOS transistor and operates based on the inverted clock signal, and
   wherein the fourth PMOS transistor connects the first PMOS transistor to the third PMOS transistor and operates based on a signal having the same logic level as the inverted clock signal and delayed as compared to the inverted clock signal.

7. The FF of claim 6, wherein the inverted clock signal and the signal delayed as compared to the inverted clock signal are each generated before the inverted pulse signal.

8. The FF of claim 7, wherein, when the input signal is logic low, before the second PMOS transistor is turned on to form a second charge path in response to transition of the inverted pulse signal to logic low, the third PMOS transistor and the fourth PMOS transistor are turned on to form an electrical connection from the first node to the power voltage line and to increase the voltage level of the first node.

9. The FF of claim 8, wherein the second charge path corresponds to an electrical path from the first node to the second PMOS transistor and the first PMOS transistor, and
   wherein, when the input signal is logic low, the first charge path corresponds to an electrical path from the first node to the third PMOS transistor, the fourth PMOS transistor, and the first PMOS transistor.

10. A flip-flop (FF) comprising:
    a first n-channel metal oxide semiconductor (NMOS) transistor connected to a ground line and operating based on an input signal;
    a first p-channel metal oxide semiconductor (PMOS) transistor connected to a power voltage line and operating based on the input signal;
    a second NMOS transistor connecting a first node to the first NMOS transistor and operating based on a pulse signal;
    a second PMOS transistor connecting the first node to the first PMOS transistor and operating based on an inverted pulse signal inverted with respect to the pulse signal;

a third NMOS transistor and a fourth NMOS transistor, connected to the second NMOS transistor in parallel, and forming a first discharge path for connecting the first node to the ground line, based at least on a clock signal;

a keeper circuit connected to the first node to maintain a voltage level of the first node; and an inverter generating an output signal by inverting a signal at the first node.

11. The FF of claim 10, wherein the third NMOS transistor connects the first node to the fourth NMOS transistor and operates based on the clock signal, and wherein the fourth NMOS transistor connects the first NMOS transistor to the third NMOS transistor and operates based on a signal having the same logic level as the clock signal and delayed as compared to the clock signal.

12. The FF of claim 11, wherein the clock signal and the signal delayed as compared to the clock signal are each generated before the pulse signal.

13. The FF of claim 12, wherein, when the input signal is logic high, before the second NMOS transistor is turned on to form a second discharge path in response to transition of the pulse signal to logic high, the third NMOS transistor and the fourth NMOS transistor are turned on to form an electrical connection from the first node to the ground line and to lower the voltage level of the first node.

14. The FF of claim 13, wherein the second discharge path corresponds to an electrical path from the first node to the second NMOS transistor and the first NMOS transistor, and wherein, when the input signal is logic high, the first discharge path corresponds to an electrical path from the first node to the third NMOS transistor, the fourth NMOS transistor, and the first NMOS transistor.

15. A flip-flop (FF) comprising:

a scan multiplexer selectively outputting either an input signal or a scan signal;

a first n-channel metal oxide semiconductor (NMOS) transistor connected to a ground line and operating based on an output signal of the scan multiplexer;

a first p-channel metal oxide semiconductor (PMOS) transistor connected to a power voltage line and operating based on the output signal of the scan multiplexer;

a second NMOS transistor connecting a first node to the first NMOS transistor and operating based on a pulse signal;

a second PMOS transistor connecting the first node to the first PMOS transistor and operating based on an inverted pulse signal inverted with respect to the pulse signal;

a third NMOS transistor and a fourth NMOS transistor connected to the second NMOS transistor in parallel, and forming a first discharge path for connecting the first node to the ground line, based at least on a clock signal;

a third PMOS transistor and a fourth PMOS transistor connected to the second PMOS transistor in parallel, and forming a first charge path for connecting the first node to the power voltage line, based at least on an inverted clock signal inverted with respect to the clock signal;

a keeper circuit connected to the first node to maintain a voltage level of the first node; and an inverter generating an output signal by inverting a signal at the first node.

16. The FF of claim 15, wherein the third NMOS transistor connects the first node to the fourth NMOS transistor and operates based on the clock signal, and wherein the fourth NMOS transistor connects the first NMOS transistor to the third NMOS transistor and operates based on a signal having the same logic level as the clock signal and delayed as compared to the clock signal.

17. The FF of claim 16, wherein each of the clock signal and the signal delayed as compared to the clock signal is generated before the pulse signal, and wherein, when the output signal of the scan multiplexer is logic high, before the second NMOS transistor is turned on to form a second discharge path in response to transition of the pulse signal to logic high, the third NMOS transistor and the fourth NMOS transistor are turned on to form an electrical connection from the first node to the ground line and to lower the voltage level of the first node.

18. The FF of claim 17, wherein the second discharge path corresponds to an electrical path from the first node to the second NMOS transistor and the first NMOS transistor, and wherein, when the output signal of the scan multiplexer is logic high, the first discharge path corresponds to an electrical path from the first node to the third NMOS transistor, the fourth NMOS transistor, and the first NMOS transistor.

19. The FF of claim 15, wherein the third PMOS transistor connects the first node to the fourth PMOS transistor and operates based on the inverted clock signal, and wherein the fourth PMOS transistor connects the first PMOS transistor to the third PMOS transistor and operates based on a signal having the same logic level as the inverted clock signal and delayed as compared to the inverted clock signal.

20. The FF of claim 19, wherein the inverted clock signal and the signal delayed as compared the inverted clock signal are each generated before the inverted pulse signal, wherein, when the output signal of the scan multiplexer is logic low, before the second PMOS transistor is turned on to form a second charge path in response to transition of the inverted pulse signal to logic low, the third PMOS transistor and the fourth PMOS transistor are turned on to form an electrical connection from the first node to the power voltage line and to increase the voltage level of the first node, wherein the second charge path corresponds to an electrical path from the first node to the second PMOS transistor and the first PMOS transistor, and wherein, when the output signal of the scan multiplexer is logic low, the first charge path corresponds to an electrical path from the first node to the third PMOS transistor, the fourth PMOS transistor, and the first PMOS transistor.

\* \* \* \* \*